(12) United States Patent
Huang et al.

(10) Patent No.: US 7,951,670 B2
(45) Date of Patent: May 31, 2011

(54) FLASH MEMORY CELL WITH SPLIT GATE STRUCTURE AND METHOD FOR FORMING THE SAME

(75) Inventors: Chen-Ming Huang, Hsinchu (TW); Hung-Cheng Sung, Hsinchu (TW); Wen-Ting Chu, Alian Township, Kaohsiung County (TW); Chang-Jen Hsieh, Hsinchu (TW); Ya-Chen Kao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1133 days.

(21) Appl. No.: 11/368,714

(22) Filed: Mar. 6, 2006

(65) Prior Publication Data

US 2007/0205436 A1    Sep. 6, 2007

(51) Int. Cl.
*H01L 21/336* (2006.01)

(52) U.S. Cl. ........ 438/257; 438/593; 438/666; 438/717; 438/733; 257/514; 257/317; 257/320; 257/E21.179; 257/E21.422

(58) Field of Classification Search .................. 438/257, 438/258, 259, 260, 261, 262, 263, 264, 256, 438/266, 267, 666, 717, 593–594, 733, 770; 257/314, 315, 317, 320, E21.179, E21.422, 257/E21.68, E21.687, E21.688
See application file for complete search history.

(56) References Cited

U.S. PATENT DOCUMENTS

| | | | | |
|---|---|---|---|---|
| 6,069,040 A * | 5/2000 | Miles et al. | | 438/260 |
| 6,090,668 A * | 7/2000 | Lin et al. | | 438/266 |
| 6,294,429 B1 * | 9/2001 | Lam et al. | | 438/260 |
| 6,409,903 B1 | 6/2002 | Chung et al. | | |
| 6,753,223 B2 * | 6/2004 | Lin | | 438/257 |
| 6,881,629 B2 * | 4/2005 | Hsieh et al. | | 438/266 |
| 2002/0064910 A1 * | 5/2002 | Chen et al. | | 438/201 |
| 2002/0187608 A1 * | 12/2002 | Tseng | | 438/257 |
| 2003/0134473 A1 * | 7/2003 | Sung et al. | | 438/257 |
| 2004/0058495 A1 * | 3/2004 | Yoon et al. | | 438/257 |
| 2004/0238878 A1 * | 12/2004 | Sato et al. | | 257/315 |
| 2005/0124117 A1 * | 6/2005 | Hyun et al. | | 438/257 |
| 2005/0176201 A1 | 8/2005 | Liu et al. | | |

FOREIGN PATENT DOCUMENTS

| | | |
|---|---|---|
| CN | 1450629 | 10/2003 |
| TW | 485473 | 5/2002 |
| TW | 560006 | 11/2003 |

OTHER PUBLICATIONS

English abstract of CN1450629.
Taiwan (Chinese language) office action dated Aug. 6, 2010.
English language translation of abstract of TW 485473 (published May 1, 2002).
English language translation of abstract of TW 560006 (published Nov. 1, 2003).

* cited by examiner

*Primary Examiner* — Matthew C Smith
*Assistant Examiner* — Su C Kim
(74) *Attorney, Agent, or Firm* — Thomas|Kayden (57) ABSTRACT

A split gate memory cell. A floating gate is disposed on and insulated from a substrate comprising an active area separated by a pair of isolation structures formed therein. The floating gate is disposed between the pair of isolation structures and does not overlap the upper surface thereof. A cap layer is disposed on the floating gate. A control gate is disposed over the sidewall of the floating gate and insulated therefrom, partially extending to the upper surface of the cap layer. A source region is formed in the substrate near one side of the floating gate.

8 Claims, 10 Drawing Sheets

FLASH MEMORY CELL WITH SPLIT GATE STRUCTURE AND METHOD FOR FORMING THE SAME

BACKGROUND OF THE INVENTION

1. Field of the Invention

The present invention relates to a semiconductor memory technology, and in particular to a flash memory cell with split gate structure and a method for forming the same.

2. Description of the Related Art

Semiconductor memory devices are commonly available in various forms, such as EPROMs, EEPROMs, and flash memory devices. Currently, flash memory, such as a split gate flash memory is widely applied in large capacity non-volatile memory technology. Typically, the split gate flash memory includes a split gate structure having a floating gate for charge storage and a control gate to control the charge storage. The split gate structure may further include a thin gate dielectric or tunnel oxide film formed between the floating gate and the active area of a substrate and an integrate dielectric film formed between the floating gate and the control gate.

Figure 4:
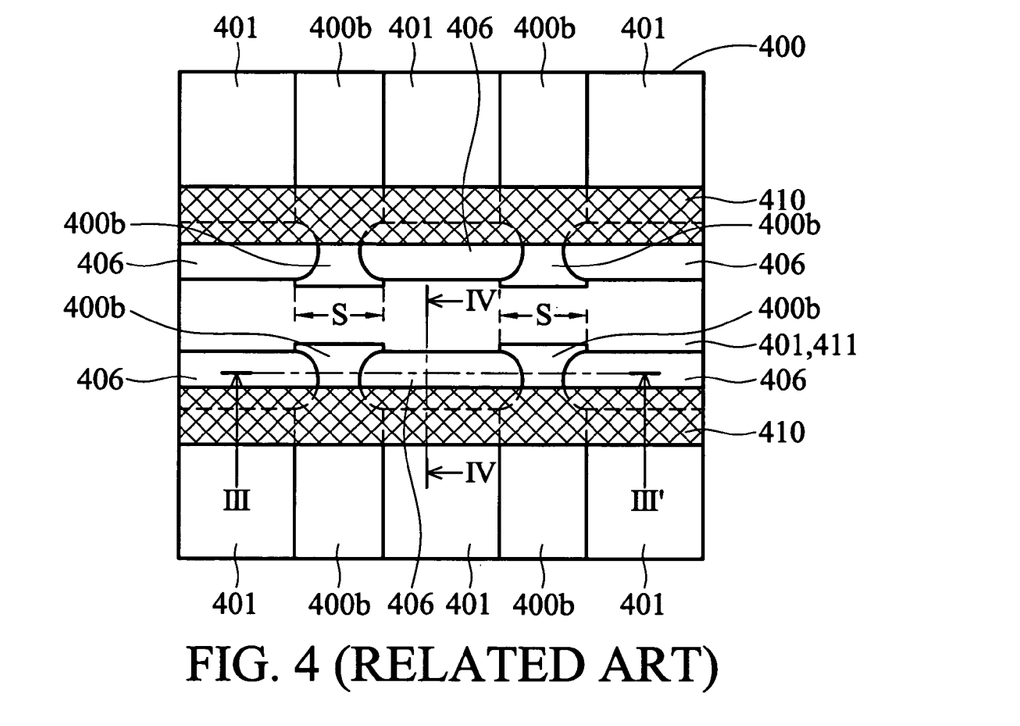
FIG. 4 shows a plan view of a conventional split gate memory array.
Figure 5A:
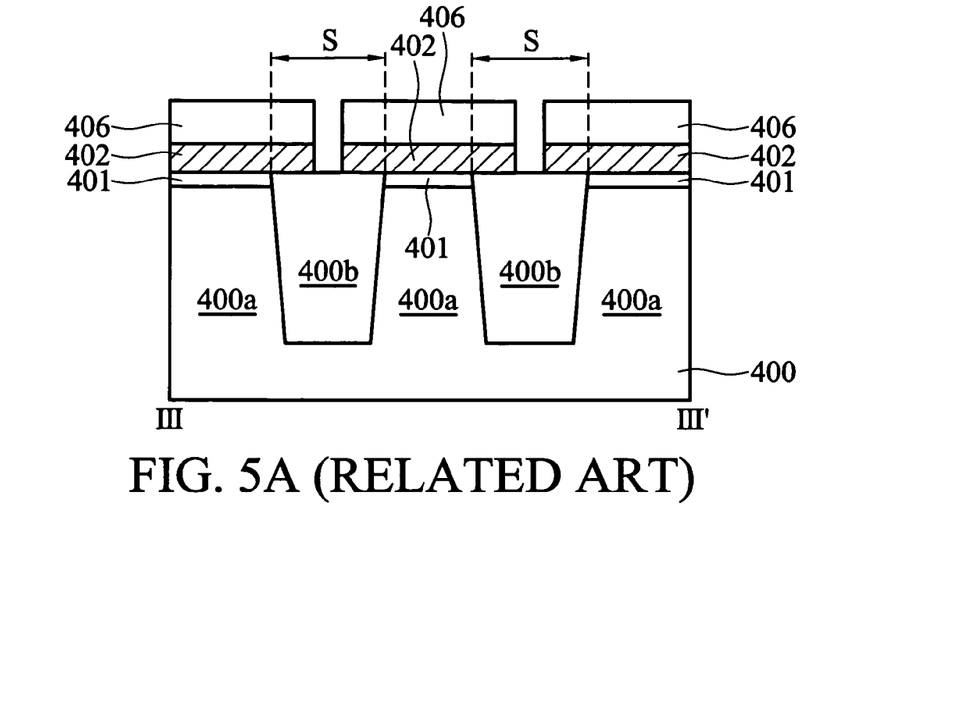
FIGS. 5A and 5B show cross-sections along III-III' and IV-IV' lines, respectively, shown in FIG. 4.
Figure 5B:
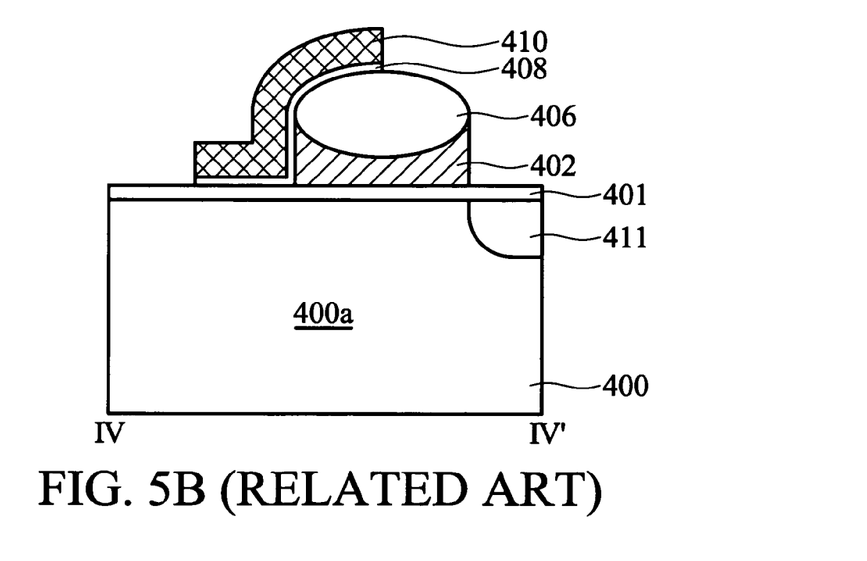

FIG. 4 shows a plan view of a conventional split gate memory array, and FIGS. 5A and 5B show cross-sections along III-III' and IV-IV' lines, respectively, shown in FIG. 4. The split gate memory array includes a plurality of split gate memory cells. In FIG. 5A, the split gate memory cell may further include a semiconductor substrate 400 having an active area 400a separated by shallow trench isolation (STI) structures 400b. A polysilicon floating gate 402 is disposed on the substrate 400 and insulated therefrom by a gate dielectric layer 401. A polysilicon control gate (word line) 410 is laterally adjacent to the floating gate 402 and insulated therefrom by an interpoly dielectric layer 408 and a thicker cap oxide layer 406 formed by local oxidation of silicon (LOCOS). A source region 411 and a drain region (not shown) are formed in the substrate 400 on both sides of the split gate structure.

Returning to FIGS. 4 and 5A, the floating gate 402 partially overlaps the pair of STI structures 400b. In order to avoid short circuits in neighboring cells, a sufficient spacing between neighboring floating gates 402 or between the neighboring active areas 400a is required. Thus, it is difficult to increase memory cell density due to the limitation of the larger active area 400a spacing (i.e. a space S between the neighboring active area 400a shown in FIG. 4 or 5A), and the integrated circuit performance cannot be further improved. Additionally, the source coupling ratio cannot be further improved due to the limitation of the thickness of the cap oxide layer 406. As is known in the art, the source coupling ratio of a split gate memory cell is generally used as a gauge to evaluate the programming and erasing efficiency of the cell. Increasing the source coupling ratio of the memory cell will generally result in an increase in the programming and erasing efficiency.

Thus, there exists a need in the art for development of an improved split gate memory cell which has a higher source coupling ratio while reducing the active area spacing.

BRIEF SUMMARY OF INVENTION

A detailed description is given in the following embodiments with reference to the accompanying drawings. A split gate memory cell and a method for forming the same are provided. An embodiment of a split gate memory cell comprises a substrate comprising an active area separated by a pair of isolation structures formed therein. A floating gate is disposed on and insulated from a substrate, and is between the pair of isolation structures and does not overlap the upper surface thereof. A cap layer is disposed on the floating gate. A control gate is disposed over the sidewall of the floating gate and insulated therefrom, partially extending to the upper surface of the cap layer. A source region is formed in the substrate near one side of the floating gate.

Another embodiment of a split gate memory cell comprises a substrate comprising a pair of shallow trench isolation structures formed therein and protruding from the upper surface thereof. A first polysilicon gate disposed on and insulated from the substrate, sandwiched between the pair of protruded shallow trench isolation structures and does not overlap the upper surface thereof. A cap oxide layer is disposed on the first polysilicon gate. A second polysilicon gate disposed over the sidewall of the first polysilicon gate and insulated therefrom, partially extends to the upper surface of the cap oxide layer.

An embodiment of a method for forming a split gate memory cell comprises providing a substrate comprising an active area separated by a pair of isolation structures formed therein. A floating gate is formed on and is insulated from the substrate, and is between the pair of protruded isolation structures and does not overlap the upper surface thereof. A cap layer is formed on the floating gate. A control gate is formed over the sidewall of the floating gate, wherein the control gate is insulated from the floating gate, and partially extends to the upper surface of the cap layer. A source region is formed in the substrate near one side of the floating gate.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims. The split gate flash memory array of this invention will be described below with reference to the accompanying drawings.

Figure 2D:
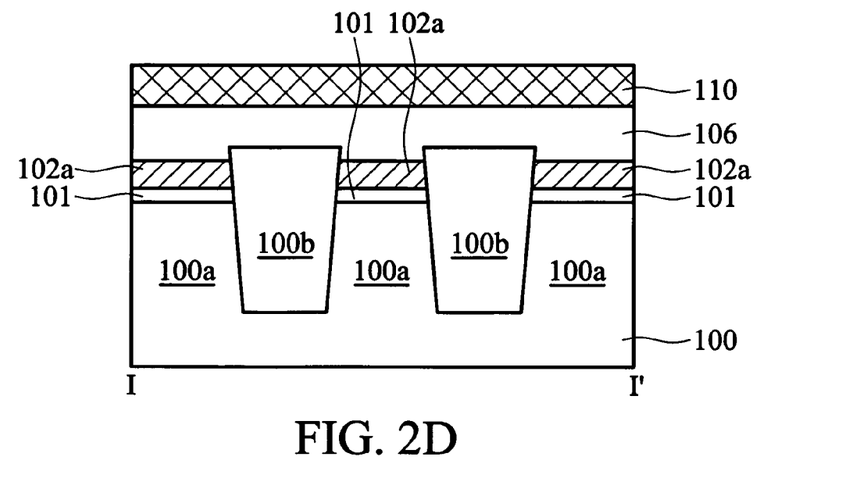
Figure 3A:
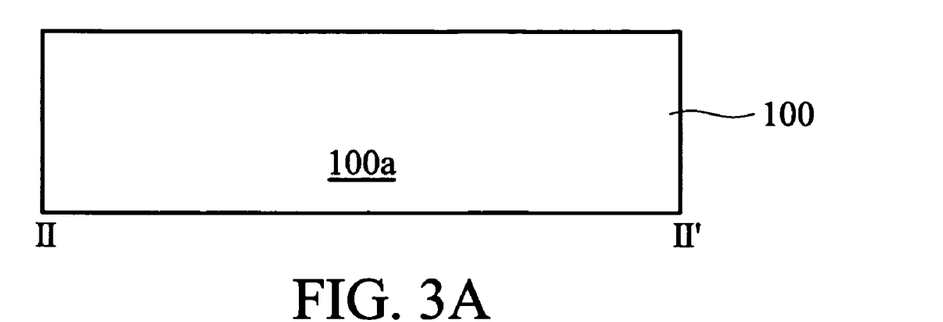
FIGS. 3A to 3F show cross-sections along II-II' line shown in FIGS. 1A to 1F.

The invention relates to an improved split gate memory cell which has a higher source coupling ratio while reducing the active area spacing, and a method for fabricating such a memory cell. Referring to FIGS. 1F, 2D and 3F, in which FIG. 1F illustrates a plan view of an embodiment of a split gate memory array and FIGS. 2D and 3F illustrates cross-sections along I-I' and II-II' lines shown in FIG. 1F. The memory array comprises a plurality of split gate memory cells. Each cell comprises a substrate 100, such as a silicon substrate or other semiconductor substrate, comprising a pair of isolation structures 100b formed therein and protruding from the upper surface thereof. In this embodiment, the isolation structures 100b may comprise field oxides formed by conventional isolation technologies, and shallow trench isolation (STI) structures are preferred. The isolation structures 100b define an active area 100a in the substrate 100, thereby forming a split gate structure thereon for the memory cell.

A floating gate 102a having tip portions at top corners is disposed on the active area 100a of the substrate 100 and insulated from the substrate 100 by a dielectric layer 101. In this embodiment, the floating gate 102a may comprise polysilicon and be sandwiched between the pair of protruded isolation structures 100b without overlapping the upper surface thereof, as shown in FIG. 2D. The dielectric layer 101 serving as a gate dielectric may comprise silicon oxide, silicon nitride or other advantageous dielectric material, preferably silicon oxide is preferred.

A cap layer 106, such as a thicker oxide layer, is disposed on the floating gate 102a. In this embodiment, the upper portion of the cap layer 106 has a substantially rectangular profile, as shown in FIG. 3F. A control gate (word line) 110 is disposed over the sidewall of the floating gate 102a and insulated therefrom by an intermediate dielectric layer 108, such as a high temperature oxide (HTO) layer, silicon nitride or other advantageous dielectric material. The control gate 110 may comprise polysilicon and partially extend to the upper surface of the cap layer 106. A source region 111 and a drain region (not shown) are formed in the substrate 100. The source region 111 is near one side of the floating gate 102a and the drain region is near one side of the control gate 110 and opposite to the source region 111.

Figure 1A:
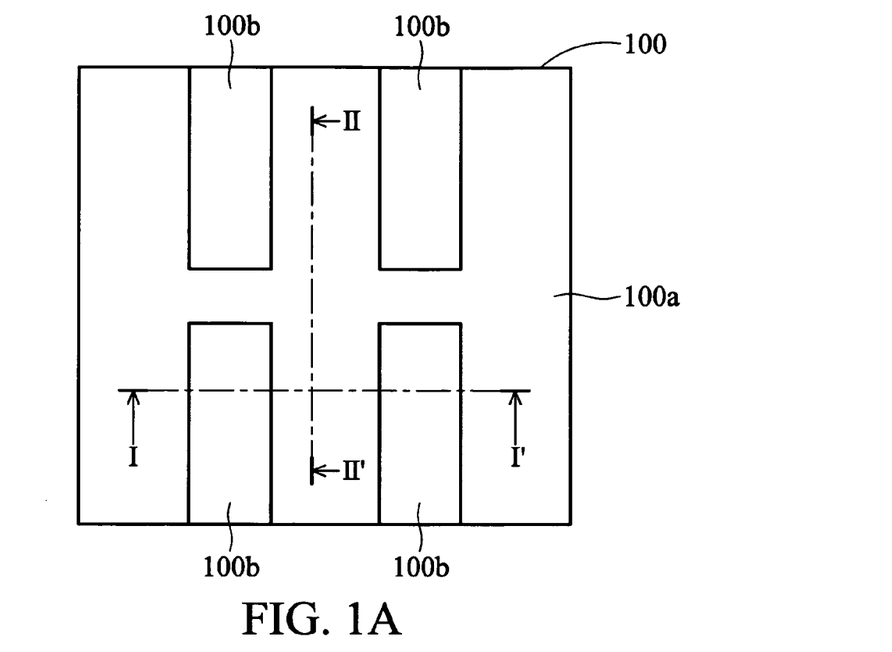
FIGS. 1A to 1F show plan views of an embodiment of a method for forming a split gate memory array.
Figure 1B:
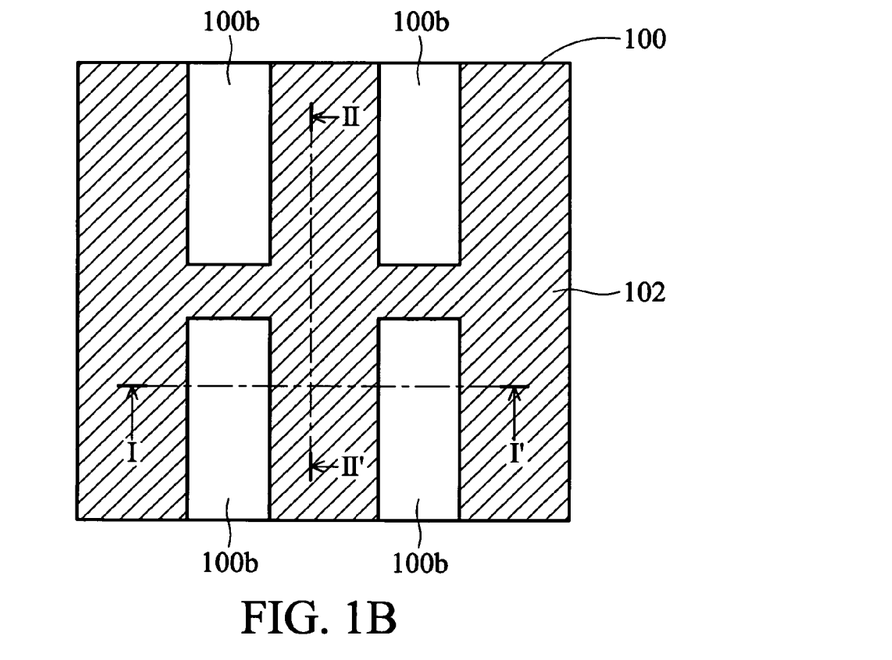
Figure 1C:
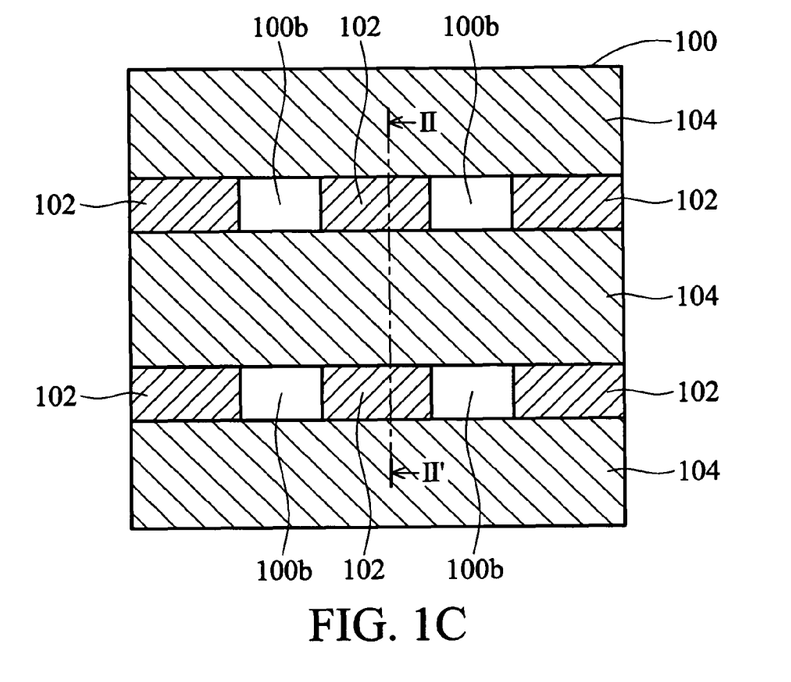
Figure 1D:
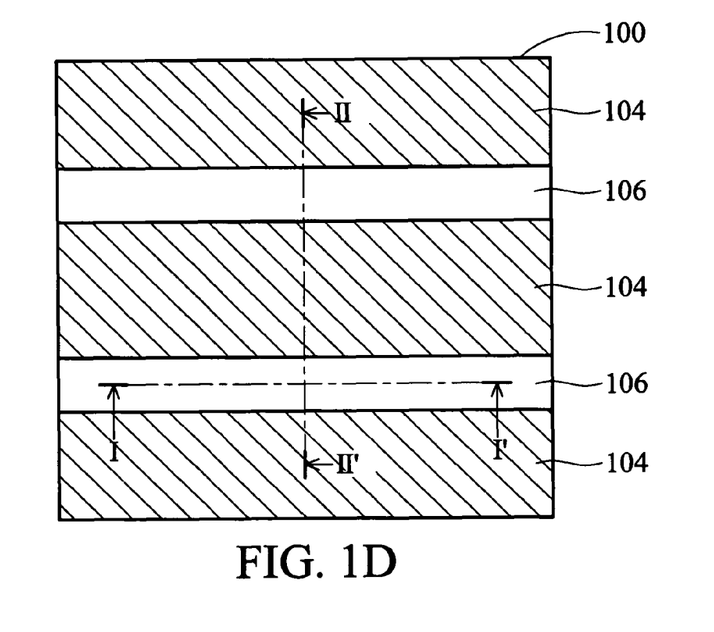
Figure 1E:
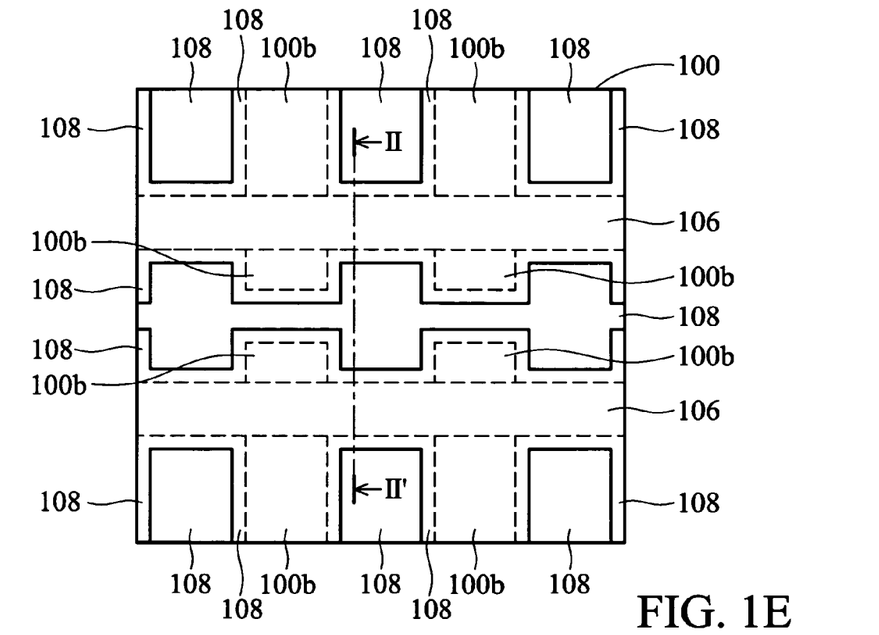
Figure 1F:
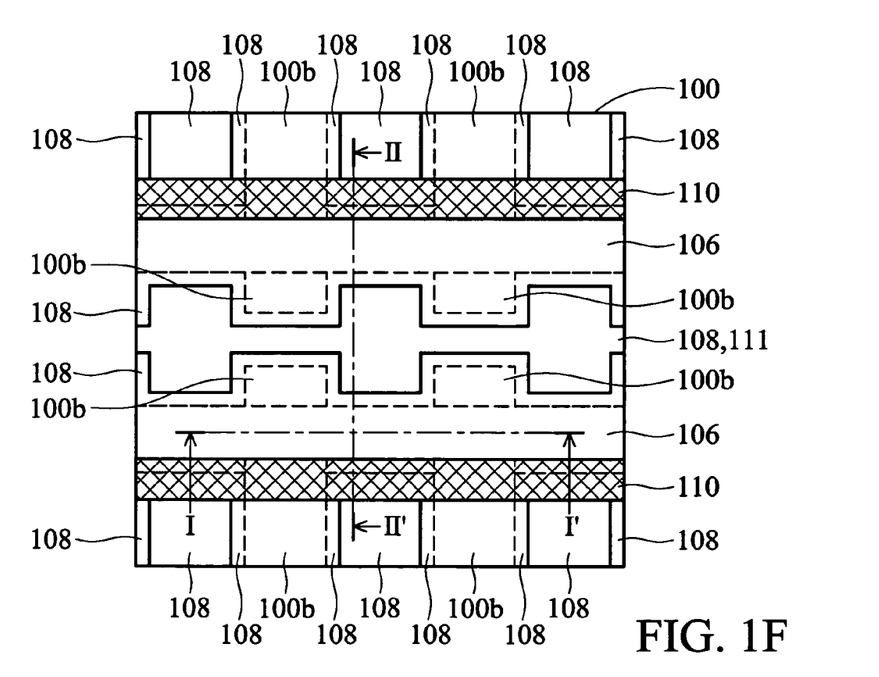
Figure 2A:
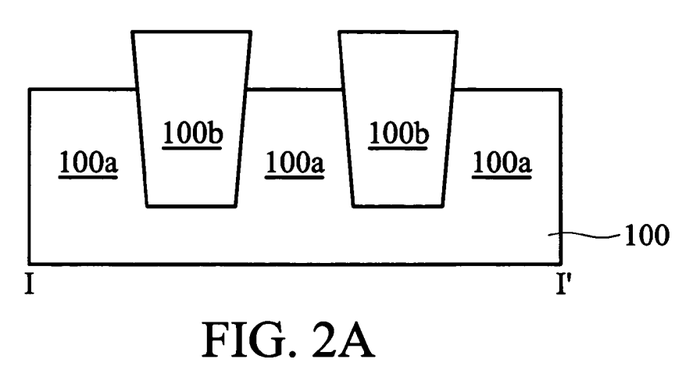
FIGS. 2A to 2D show cross-sections along I-I' line shown in FIGS. 1A, 1B, 1D and 1F, respectively.

Referring to FIGS. 1A to 1F, 2A to 2D and 3A to 3F, in which FIGS. 1A to 1F illustrate plan views of an embodiment of a method for forming a split gate memory array. FIGS. 2A to 2D illustrate cross-sections along I-I' line shown in FIGS. 1A, 1B, 1D and 1F, respectively, and FIGS. 3A to 3F illustrate cross-sections along II-II' line shown in FIGS. 1A to 1F. In FIGS. 1A, 2A and 3A, a substrate 100, such as a silicon substrate or other semiconductor substrates is provided. The substrate 100 may comprise a plurality of pairs of isolation structures 100b to define an active area 100a in the substrate 100. The isolation structures 100b can be field oxides formed by conventional LOCOS or STI technologies. In this embodiment, an STI structure is used as an example for description. In order to simplify the diagram and description, only two pairs of STI structures 100b are depicted in FIG. 1A. In FIG. 2A, the pair of STI structures 100b is protruded from the substrate 100 due to removal of a hard mask (not shown) used in formation of STI structures.

Figure 2B:
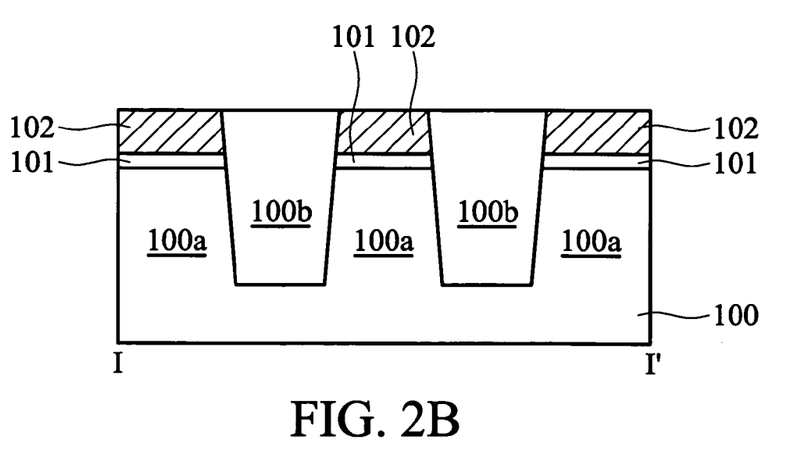
Figure 3B:
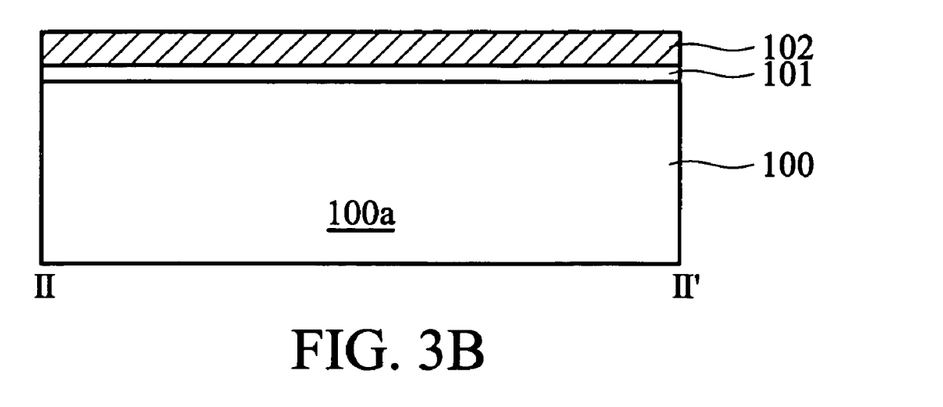

In FIGS. 1B, 2B and 3B, a dielectric layer 101 serving as a gate dielectric is formed on the active area 100a of the substrate 100. The dielectric layer 101 may comprise silicon oxide, silicon nitride or other advantageous dielectric material, formed by conventional deposition or thermal oxidation. Preferably, the dielectric layer 101 comprises a silicon oxide formed by thermal oxidation. Moreover, the dielectric layer 101 has a thickness of about 50 Å to 200 Å, depending upon the level of scaling, and in one embodiment is about 90 Å. After formation of the dielectric layer 101. A conductive layer (not shown), such as a polysilicon layer, is formed on the dielectric layer 101 and entirely covers the STI structures 100b by, for example, CVD. Thereafter, an etch back process, such as CMP, is performed on the conductive layer using the STI structures 100b as stop layers, such that the remaining conductive layer 102 is substantially sandwiched between and is level with the protruded STI structures 100b, as shown in FIG. 2B.

Figure 3C:
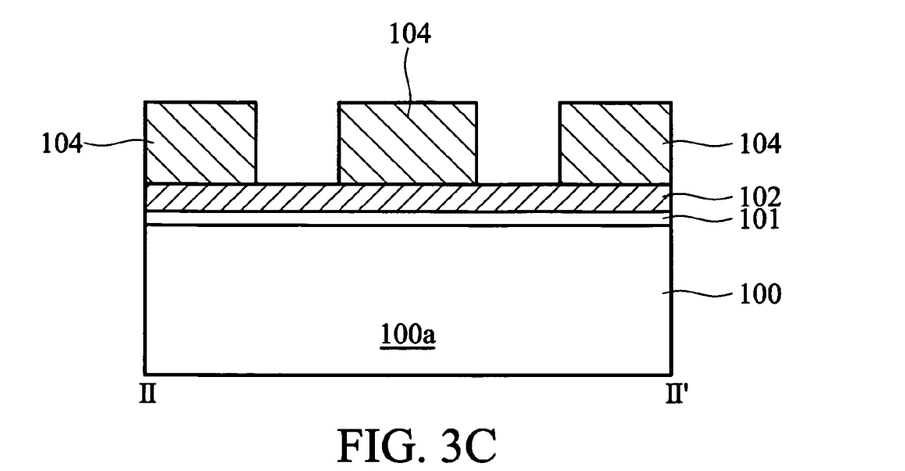

In FIGS. 1C and 3C, a masking pattern layer 104 formed by conventional lithography and etching is formed on the conductive layer 102 to expose portions of the conductive layer 102 serving as floating gate regions and portions of the STI structures 100b. The masking pattern layer 104 may comprise silicon nitride and has a thickness of about 1000 Å to 2000 Å, depending upon a desired thickness of the subsequent cap layer, and in one embodiment is about 1600 Å.

Figure 2C:
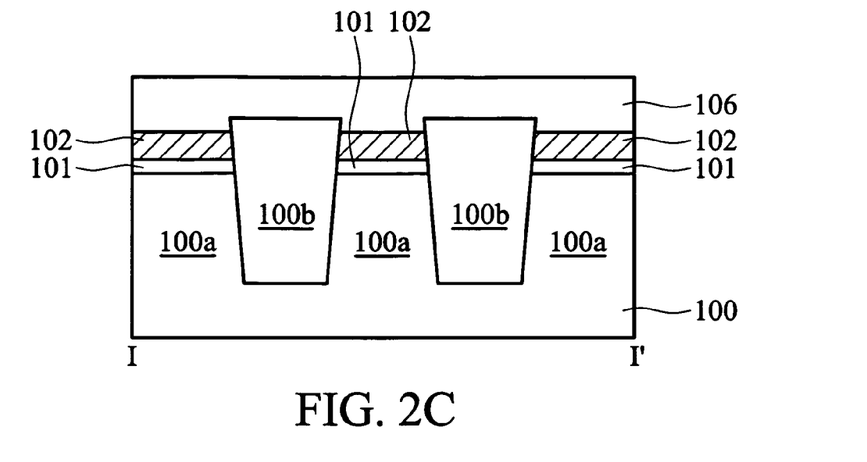
Figure 3D:
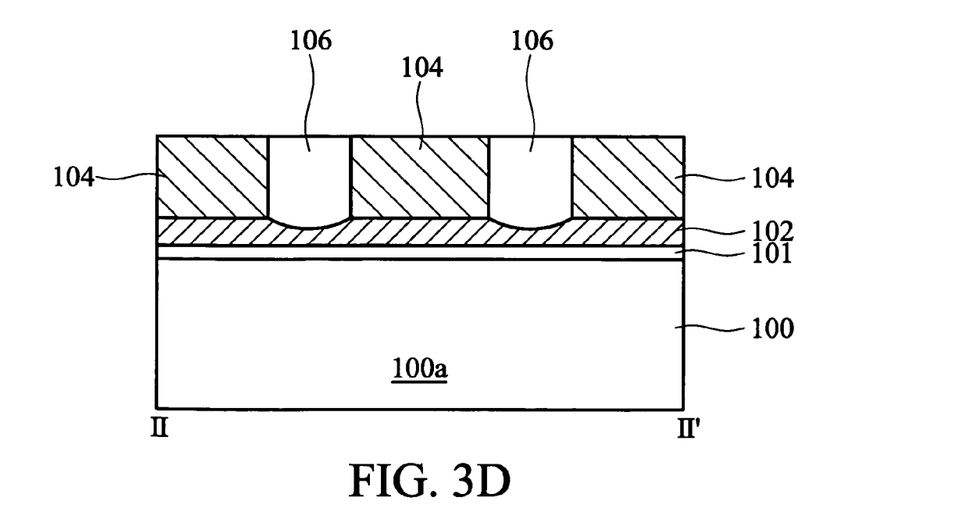

In FIGS. 1D, 2C and 3D, the exposed conductive layer 102 is recessed by, for example, dry etching, to form a sloping surface. A dielectric layer (not shown) is filled in the spaces created by the recessed conductive layer 102 and the masking pattern layer 104, and covers the masking pattern layer 104. The dielectric layer may comprise TEOS oxide formed by, for example, low-pressure CVD or other deposition well known in the art. Thereafter, etch back process, such as CMP, is performed on the dielectric layer using the masking pattern layer 104 as a stop layer. The remaining dielectric layer forms cap layers 106 where each upper portion has a substantially rectangular profile, as shown in FIG. 3D.

Figure 3E:
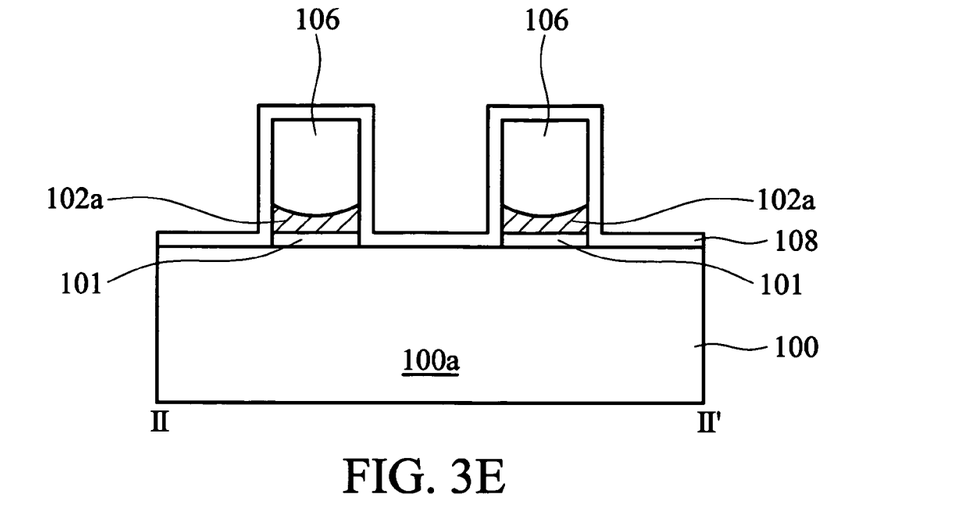
Figure 3F:
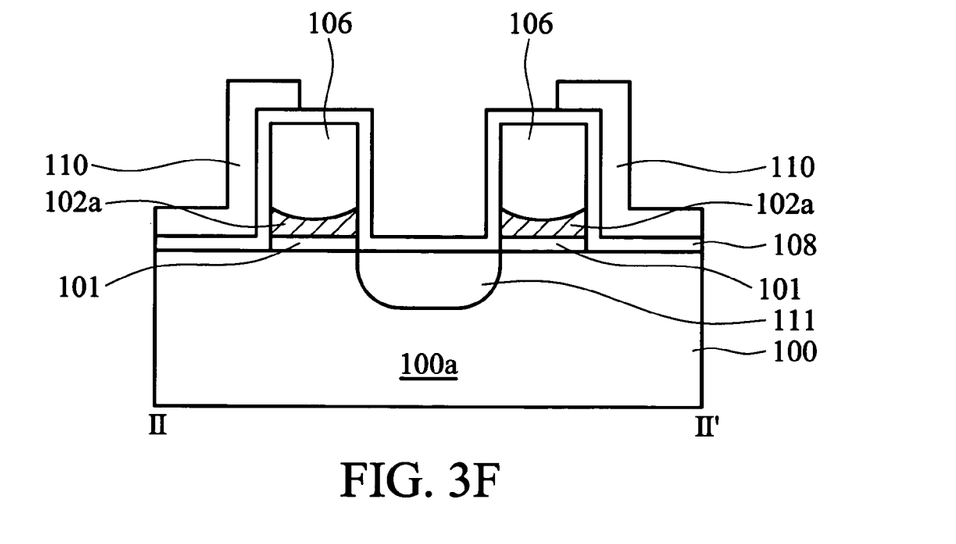

In FIGS. 1E and 3E, the masking pattern layer 104 shown in FIGS. 1D and 3D is removed by etching, to expose portions of STI structures 100b and the conductive layer 102 uncovered by the cap layer 106. Next, the exposed conductive layer 102 is removed using the cap layers 106 and the portions of exposed STI structures 100b as etch masks, to expose the substrate 100 and leave portions of the conductive layer 102a serving as a floating gate. Since the conductive layer 102 under the cap layer 106 has a sloping surface, the floating gate 102a has tip portions on top corners after removing the conductive layer 102 under the masking pattern layer 104. A conformal dielectric layer 108 is subsequently deposited on the substrate 100 and the surfaces of the floating gates 102a, the cap layers 106 and the exposed STI structures 100b. The conformal dielectric layer 108 may comprise high temperature oxide formed by CVD. Moreover, the conformal dielectric layer 108 has a thickness of about 100 Å to 200 Å, depending upon the level of scaling, and in one embodiment is about 155 Å. The portion of the conformal dielectric layer 108 formed on both sides of each floating gate 102a serves as an intermediate dielectric layer between the floating gate 102a and the subsequent control gate.

In FIGS. 1F, 2D and 3F, a conformal conductive layer (not shown), such as a polysilicon layer, may be formed on the structure shown in FIGS. 1E and 3E by, for example, CVD or other deposition well known in the art. The conductive layer is subsequently patterned by etching to form a control gate (word line) 110 over the sidewall of the floating gate 102a. The control gate 110 is insulated from the floating gate 102a by the intermediate dielectric layer 108 and partially extends to the upper surface of the cap layer 106. Ion implantation may be performed in the substrate 100 to form a source region 111 and a drain region (not shown). The source region 111 is near one side of the floating gate 102a and the drain region is near one side of the control gate 110 and opposite to the source region 111. A drive in process may be optionally performed to laterally extend the source region 111 under the floating gate 102a, as shown in FIG. 3F, thus a split gate memory cell (array) of the invention is completed. Additionally, the exposed dielectric layer 101 may be further removed by etching, to expose the substrate 100.

In erasing, the efficiency of the split gate memory cell will be improved if the voltage coupled to the floating gate ($V_{fg}$) is lower, and in programming, the efficiency of the split gate memory cell will be improved if is $V_{fg}$ higher.

Erasing status:

$$V_{fg}=V_{cg}\times GCR,$$

wherein $V_{cg}$ represents the voltage applied to the control gate and GCR is the gate coupling ratio.

Programming status:

$$V_{fg}=V_s\times SCR+V_{cg}\times GCR+V_d\times DCR,\text{ and}$$

$$SCR+GCR+DCR=1,$$

wherein $V_s$ and $V_d$ respectively represent the voltage applied to the source and drain and SCR and DCR are the source and drain coupling ratios, respectively.

Accordingly, increasing the SCR of the cell and/or reducing the GCR of the cell may improve the cell's programming and erasing efficiency.

According to the invention, since the floating gate 102a is disposed between the pair of isolation structures 100b and does not overlap the upper surface thereof, the capacitance between the control gate and floating gate is lower than that of the floating gate overlapping the upper surface of the isolation structures. That is, the invention provides relatively lower GCR with respect to the conventional memory cell where the floating gate overlaps the STI structures, improving the programming and erasing efficiency. Moreover, since the cap layer 106 of the invention is formed by a damascene method, the height of the cap layer 106 can be easily increased by increasing the thickness of the masking pattern layer 104. That is, the height of the cap layer 106 of the invention can be higher than that formed by LOCOS, thereby further reducing the GCR to relatively increase the SCR. Accordingly, the programming and erasing efficiency can be further improved. Additionally, since the floating gate 102a does not overlap the neighboring isolation structures 100b, the spacing between the floating gates 102a and the active area 100a spacing can be reduced to increase memory cell density. Thus, the integrated circuit performance can be further improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a split gate memory cell, comprising:

providing a substrate comprising an active area separated by a pair of isolation structures formed therein;

forming a floating gate on the active area of the substrate, wherein the floating gate is insulated from the substrate and is disposed between the pair of isolation structures and does not overlap the upper surface thereof;

forming a cap layer on the floating gate, wherein the upper portion of the cap layer has a substantially rectangular profile;

forming a control gate over the sidewall of the floating gate, insulated from the floating gate, partially extending to the upper surface of the cap layer; and forming a source region in the substrate near one side of the floating gate;

wherein formation of the floating gate and deposition of the cap layer comprise:

successively forming a first dielectric layer and a conductive layer on the substrate, wherein the conductive layer is disposed between the pair of the isolation structures and does not overlap the upper surface thereof;

forming a masking pattern layer on the conductive layer to expose a portion of the conductive layer serving as a floating gate region;

recessing the exposed conductive layer by dry etching;

depositing a second dielectric layer on the recessed conductive layer, serving as the cap layer; and removing the masking pattern layer and the underlying conductive and first dielectric layers using the second dielectric layer as an etch mask, to expose the substrate and leave a portion of the conductive layer serving as the floating gate.

2. The method as claimed in claim 1, wherein the pair of isolation structures is a shallow trench isolation structure.

3. The method as claimed in claim 1, wherein the first and second dielectric layers comprise oxide.

4. The method as claimed in claim 1, wherein the conductive layer comprises polysilicon.

5. The method as claimed in claim 1, wherein the masking pattern layer comprises silicon nitride.

6. The method as claimed in claim 1, wherein the control gate comprises polysilicon.

7. The method as claimed in claim 1, wherein the control gate is insulated from the floating gate by an intermediate dielectric layer.

8. The method as claimed in claim 7, wherein the intermediate dielectric layer comprises high temperature oxide.

* * * * *